US010396108B2

(12) United States Patent
Ito

(10) Patent No.: US 10,396,108 B2
(45) Date of Patent: Aug. 27, 2019

(54) SOLID-STATE IMAGING ELEMENT, SOLID-STATE IMAGING ELEMENT MANUFACTURING METHOD, AND ELECTRONIC APPARATUS

(71) Applicant: SONY SEMICONDUCTOR SOLUTIONS CORPORATION, Kanagawa (JP)

(72) Inventor: Kyosuke Ito, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 15/768,732

(22) PCT Filed: Oct. 13, 2016

(86) PCT No.: PCT/JP2016/080298
§ 371 (c)(1),
(2) Date: Apr. 16, 2018

(87) PCT Pub. No.: WO2017/073334
PCT Pub. Date: May 4, 2017

(65) Prior Publication Data
US 2018/0315787 A1 Nov. 1, 2018

(30) Foreign Application Priority Data
Oct. 27, 2015 (JP) ................. 2015-210941

(51) Int. Cl.
H01L 27/146 (2006.01)
H04N 5/374 (2011.01)
H04N 5/361 (2011.01)

(52) U.S. Cl.
CPC ...... H01L 27/14605 (2013.01); H01L 27/146 (2013.01); H01L 27/1464 (2013.01);
(Continued)

(58) Field of Classification Search
None
See application file for complete search history.

(56) References Cited

U.S. PATENT DOCUMENTS

2002/0001039 A1  1/2002  Ishiwata
2004/0000681 A1  1/2004  Shinohara
(Continued)

FOREIGN PATENT DOCUMENTS

JP  2002-016242  1/2002
JP  2004-193547  7/2004
(Continued)

OTHER PUBLICATIONS

International Search Report prepared by the Japan Patent Office dated Dec. 5, 2016, for International Application No. PCT/JP2016/080298.

Primary Examiner — Dung A. Le
(74) Attorney, Agent, or Firm — Sheridan Ross P.C.

(57) ABSTRACT

The present technology relates to a solid-state imaging element, a solid-state imaging element manufacturing method, and an electronic apparatus that make it possible to suppress both junction leakage and diffusion leakage of an FD in an FD storage sensor. The present technology includes a photodiode, a photoelectric conversion film, a diffusion layer, and an impurity layer. The photodiode and the photoelectric conversion film perform photoelectric conversion of incident light. The diffusion layer has a second polarity, which is different from a first polarity possessed by the photodiode, and stores an electric charge derived from photoelectric conversion by the photoelectric conversion film. The impurity layer includes impurities having the first polarity. The photodiode and the diffusion layer are disposed on an identical substrate in parallel with each other. The impurity layer is disposed below the diffusion layer. The
(Continued)

present technology is applicable to solid-state imaging elements.

8 Claims, 13 Drawing Sheets

(52) U.S. Cl.
CPC .. *H01L 27/14603* (2013.01); *H01L 27/14643* (2013.01); *H01L 27/14665* (2013.01); *H01L 27/14683* (2013.01); *H01L 27/14689* (2013.01); *H04N 5/361* (2013.01); *H04N 5/374* (2013.01); *H01L 27/1463* (2013.01); *H01L 27/14612* (2013.01); *H01L 27/14636* (2013.01)

(56) References Cited

U.S. PATENT DOCUMENTS

| | | | |
|---|---|---|---|
| 2007/0273945 A1 | 11/2007 | Furman | |
| 2009/0250733 A1 | 10/2009 | Adkisson | |
| 2012/0199933 A1 | 8/2012 | Kobayashi | |
| 2014/0077271 A1* | 3/2014 | Fujii | H01L 27/1461 |
| | | | 257/239 |
| 2014/0146211 A1 | 5/2014 | Mori | |
| 2014/0209876 A1 | 7/2014 | Park | |
| 2018/0286922 A1* | 10/2018 | Togashi | H01L 27/281 |

FOREIGN PATENT DOCUMENTS

| | | |
|---|---|---|
| JP | 2007-273945 | 10/2007 |
| JP | 2011-082426 | 4/2011 |
| JP | 2015-053296 | 3/2015 |
| WO | WO 2013-021577 | 2/2013 |

\* cited by examiner

F I G. 1
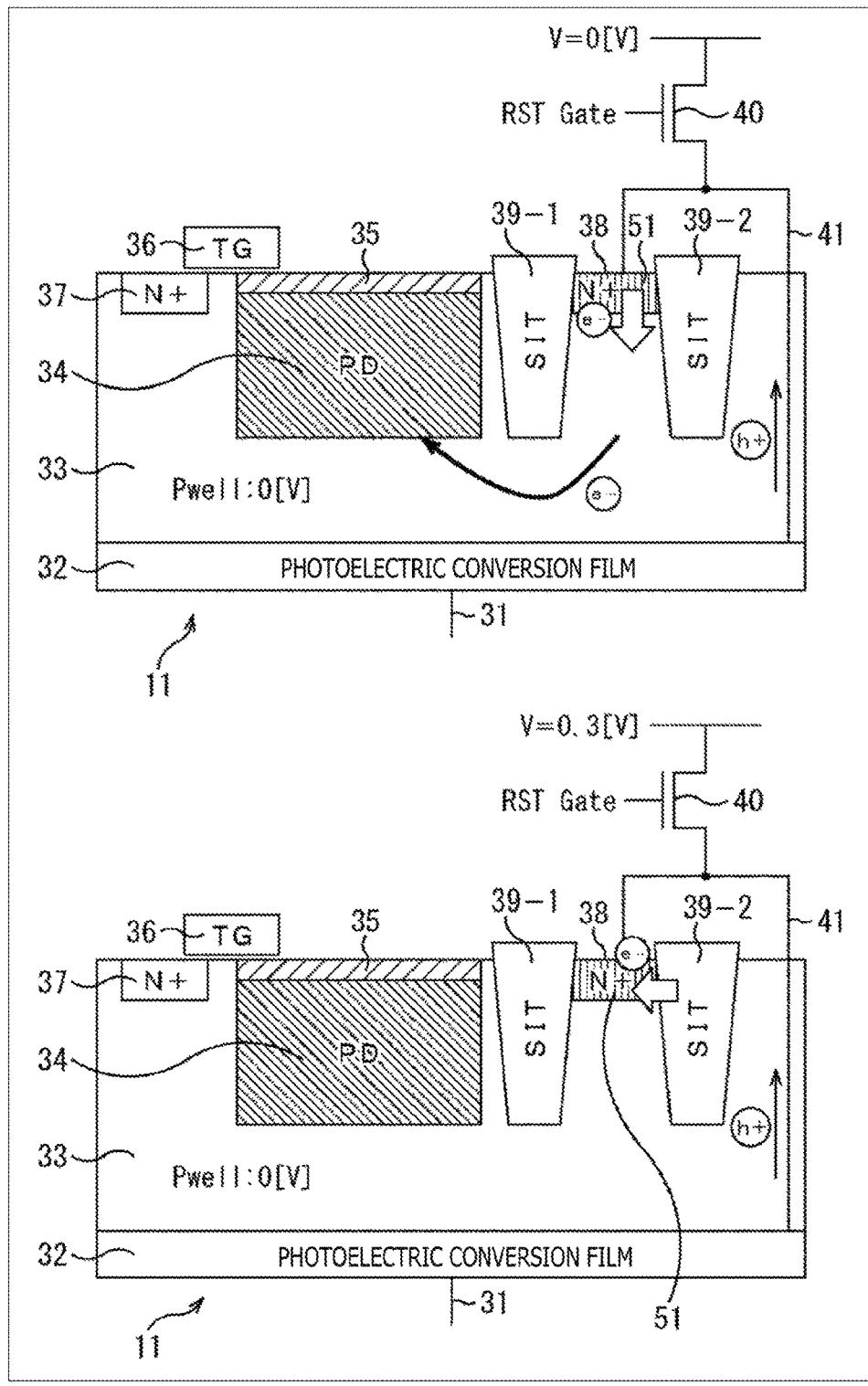

SOLID-STATE IMAGING ELEMENT, SOLID-STATE IMAGING ELEMENT MANUFACTURING METHOD, AND ELECTRONIC APPARATUS

CROSS REFERENCE TO RELATED APPLICATIONS

This application is a national stage application under 35 U.S.C. 371 and claims the benefit of PCT Application No. PCT/JP2016/080298 having an international filing date of 13 Oct. 2016, which designated the United States, which PCT application claimed the benefit of Japanese Patent Application No. 2015-210941 filed 27 Oct. 2015, the entire disclosures of each of which are incorporated herein by reference.

TECHNICAL FIELD

The present technology relates to a solid-state imaging element, a solid-state imaging element manufacturing method, and an electronic apparatus, and particularly relates to a solid-state imaging element, a solid-state imaging element manufacturing method, and an electronic apparatus that make it possible to suppress both junction leakage and diffusion leakage of an FD in an FD storage sensor.

BACKGROUND ART

A sensor proposed in recent years performs photoelectric conversion with an organic film or other photoelectric conversion film and directly stores the resulting signal charge on a diffusion layer (hereinafter referred to as the FD (Floating Diffusion)) formed on a Si (silicon) substrate.

If, for example, an FD, a PD (Photo Diode), and a pixel transistor are separately disposed on an identical substrate by means of element isolation such as STI (Shallow Trench Isolation), which is achieved by forming a shallow trench in a Si substrate and then filling the shallow trench with an insulator including $SiO_2$ or other oxide film, an electric field with respect to Pwell and STI regions can be relaxed to suppress junction leakage by lowering the RST Drain voltage of the FD (refer, for example, to PTL 1 and PTL 2).

CITATION LIST

[Patent Literature]
[PTL 1]
  JP 2015-076722A
[PTL 2]
  JP 2015-050331A

SUMMARY

Technical Problems

However, if the RST Drain voltage is lower than depletion potential of the PD and the Drain voltage of the pixel transistor, diffusion leakage occurs from the FD to the PD and the pixel transistor.

The diffusion leakage is observed as an h+ dark current in the ED or observed as an e− dark current of a PD region if the PD region is adjacent.

Further, if the RST Drain voltage is set to be higher in order to reduce the diffusion current of the FD region, junction leakage occurs due to a strong electric field between the FD region and the Pwell or STI region.

The present technology has been made in view of the above circumstances and suppresses both junction leakage and diffusion leakage of the FD particularly in the FD storage sensor.

[Solution to Problems]

A solid-state imaging element according to an aspect of the present technology includes a photodiode, a photoelectric conversion film, a diffusion layer, and an impurity layer. The photodiode performs photoelectric conversion on the basis of the amount of incident light. The photoelectric conversion film performs photoelectric conversion on the basis of the amount of incident light. The diffusion layer has a second polarity, which is different from a first polarity possessed by the photodiode, and stores an electric charge derived from photoelectric conversion by the photoelectric conversion film. The impurity layer includes impurities having the first polarity. The photodiode and the diffusion layer are disposed on an identical substrate in parallel with each other. The impurity layer is disposed below the diffusion layer.

The impurity layer may be disposed below the diffusion layer at a concentration higher than a predetermined value.

The impurity layer may be disposed below the diffusion layer at a concentration higher than 2.00 $E+15/cm^2$.

The impurity layer may be disposed below the diffusion layer and at a predetermined distance from the diffusion layer.

The impurity layer may be disposed below the diffusion layer with a predetermined substance sandwiched between the impurity layer and the diffusion layer.

The predetermined substance may include an impurity layer having the second polarity.

A solid-state imaging element manufacturing method according to an aspect of the present technology is a method of manufacturing a solid-state imaging element that includes a photodiode, a photoelectric conversion film, a diffusion layer, and an impurity layer. The photodiode performs photoelectric conversion on the basis of the amount of incident light. The photoelectric conversion film performs photoelectric conversion on the basis of the amount of incident light. The diffusion layer has a second polarity, which is different from a first polarity possessed by the photodiode, and stores an electric charge derived from photoelectric conversion by the photoelectric conversion film. The impurity layer includes impurities having the first polarity. The photodiode and the diffusion layer are disposed on an identical substrate in parallel with each other. The impurity layer is disposed below the diffusion layer.

An electronic apparatus according to an aspect of the present technology includes a photodiode, a photoelectric conversion film, a diffusion layer, and an impurity layer. The photodiode performs photoelectric conversion on the basis of the amount of incident light. The photoelectric conversion film performs photoelectric conversion on the basis of the amount of incident light. The diffusion layer has a second polarity, which is different from a first polarity possessed by the photodiode, and stores an electric charge derived from photoelectric conversion by the photoelectric conversion film. The impurity layer includes impurities having the first polarity. The photodiode and the diffusion layer are disposed on an identical substrate in parallel with each other. The impurity layer is disposed below the diffusion layer.

In as aspect of the present technology, the photodiode performs photoelectric conversion on the basis of the amount of incident light. The photoelectric conversion film performs photoelectric conversion on the basis of the amount of incident light. The diffusion layer having the second polarity, which is different from the first polarity possessed by the photodiode, stores an electric charge derived from photoelectric conversion by the photoelectric conversion film. The impurity layer includes impurities having the first polarity. The photodiode and the diffusion layer are disposed on an identical substrate in parallel with each other. The impurity layer is disposed below the diffusion layer.

[Advantageous Effect of Invention]

According to an aspect of the present technology, it is possible to suppress both junction leakage and diffusion leakage of an FD in an FD storage sensor.

BRIEF DESCRIPTION OF DRAWINGS

FIG. 1 is a diagram illustrating an exemplary configuration of a common solid-state imaging element.

DESCRIPTION OF EMBODIMENTS

First Embodiment

Figure 2:
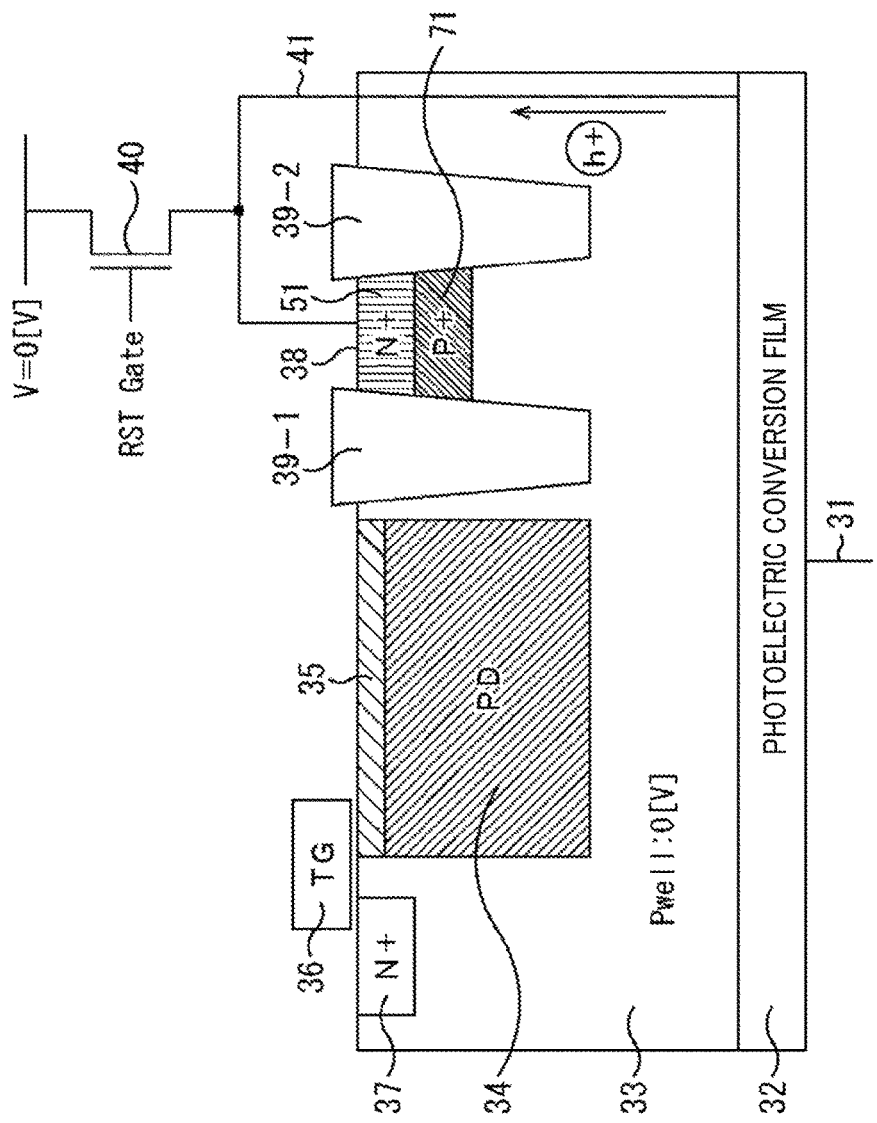
FIG. 2 is a diagram illustrating a solid-state imaging element according to a first embodiment of the present technology.

<Exemplary Configuration of Existing Solid-State Imaging Element According to Embodiment>

Before the description of a solid-state imaging element according to the present technology, a configuration of a common solid-state imaging element will be described with reference to a side cross-sectional view in FIG. 1.

A solid-state imaging element 11 depicted in the upper half and lower half of FIG. 1 receives incident light from the underside of FIG. 1. A photoelectric conversion film 32 including an organic film generates an electric charge by performing photoelectric conversion on the basis of the amount of incident light. Further, a photodiode (hereinafter referred to also as a PD) 34 disposed below the photoelectric conversion film 32 (disposed above the photoelectric conversion film 32 in FIG. 1) also generates an electric charge based on the amount of incident light. Note that the configurations of the solid-state imaging element 11 depicted in the upper half and lower half of FIG. 1 are basically the same. If the configurations need not be distinguished from each other, the configurations will be described without distinguishing between them. Moreover, in the subsequent description, all references to direction (upper and lower) are as viewed in the drawings unless otherwise stated.

More specifically, the solid-state imaging element 11 depicted in FIG. 1 is configured so that the photoelectric conversion film 32 including an organic film is disposed in the lower part, and that an upper electrode 31 of the solid-state imaging element 11 is disposed below the photoelectric conversion film 32. The photoelectric conversion film 32 generates a hole charge (indicated by an encircled "h+" mark in the drawings) in accordance with the amount of incident light, and transfers the generated charge to an FD 38 through a wiring 41.

A Pwell 33 including a Si substrate is formed on the photoelectric conversion film 32. A photodiode (hereinafter referred to also as the PD (Photo Diode)) 34 is formed on the left side of the Pwell 33 depicted in FIG. 1. More specifically, the PD 34 includes an N-type impurity layer (charge storage layer), and a high-concentration P-type impurity layer 35 acting as a depletion prevention layer (pinning layer) is additionally disposed over the N-type impurity layer.

An FD 37 is disposed to the left of the P-type impurity layer 35 depicted in FIG. 1. The FD 37 acts as a diffusion layer for storing an electric charge generated by the PD 34. Referring to FIG. 1, a transfer gate (TG) 36 is formed in the left-right direction so as to straddle over the P-type impurity layer 35 and the FD 37. When controlled to be on, the transfer gate 36 transfers the electric charge stored in the PD 34 to the FD 37 for the PD 34 including a high-concentration N-type impurity layer through the P-type impurity layer 35.

Meanwhile, on the right side of the Pwell 33 depicted in FIG. 1, after the formation of a shallow trench, the FD 38, which includes a high-concentration N-type impurity layer 51 to act as a diffusion layer for the photoelectric conversion film 32, is formed in a region between STI (Shallow Trench Isolation) regions 39-1 and 39-2, which are formed by filling the shallow trench with an insulator including $SiO_2$ or other oxide film.

Further, the wiring 41, which connects the photoelectric conversion film 32 to the FD 38, is connected to the source of a reset gate (RST Gate) 40.

As the above-described configuration is employed, the PD 34 and the photoelectric conversion film 32 including an organic film can be disposed on an identical substrate, and a hole charge derived from photoelectric conversion based on the amount of incident light in the photoelectric conversion film 32 is transferred to and stored in the FD 38. Additionally, an electric charge generated in the PD 34 due to photoelectric conversion based on the amount of incident light is transferred to and stored in the FD 37. Moreover, when the reset gate (RST Gate) 40 is turned on, the electric charge stored in the FD 38, which is transferred from the photoelectric conversion film 32, is discharged.

Here, in a situation where the employed structure is such that the FD 38 and the PD 34 are separated by element isolation regions such as the STI regions 39-1 and 39-2 as indicated in the upper half of FIG. 1, diffusion leakage occurs from the FD 38 when the drain voltage of the reset gate 40 of the FD 38 is set to the same 0 V as a substrate potential.

As illustrated in the upper half of FIG. 1, when an electric charge e– moves to the PD 34 as indicated by an arrow, the above diffusion leakage is observed as an h+ dark current (indicated by an encircled "h+" mark in FIG. 1) in the FD 38 and observed as an e– dark current (indicated by an encircled "e–" mark in FIG. 1) in the adjacent PD 34.

Therefore, if, as illustrated in the lower half of FIG. 1, the drain voltage of the reset gate 40 is set to be slightly higher than the substrate potential (e.g., approximately +0.3 V), the diffusion leakage from the FD 38 is significantly suppressed because the potential of the FD 38 is higher than that of the Pwell 33. This makes it possible to suppress the dark current of the PD 34 and the dark current of the FD 38.

However, in the lower half of FIG. 1, junction leakage is highly likely to occur due to a strong electric field between the FD 38 and the Pwell 33 or the STI regions 39-1 and 39-2.

That is to say, both junction leakage and diffusion leakage of the FD 38 might occur in an FD storage sensor as illustrated in FIG. 1. It is therefore preferable that an appropriate configuration be employed to inhibit the occurrence of both the junction leakage and the diffusion leakage.

<Solid-State Imaging Element According to First Embodiment to which Present Technology is Applied>

An exemplary configuration of the solid-state imaging element to which the present technology is applied will now be described with reference to the side cross-sectional view of FIG. 2. Note that components of the solid-state imaging element depicted in FIG. 2 that have the same functions as those of the solid-state imaging element depicted in FIG. 1 will be designated by the same name and the same reference numerals as their counterparts and will not redundantly be described.

More specifically, the solid-state imaging element 11 depicted in FIG. 2 differs from the solid-state imaging element 11 depicted in FIG. 1 in that a P-type impurity layer 71 including high-concentration P-type impurities is disposed below the N-type impurity layer 51 included in the FD 38, which stores an electric charge generated by the photoelectric conversion film 32.

The P-type impurity layer 71 is isolated from the FD 38, which stores a hole charge from the photoelectric conversion film 32, and isolated from the FD 37, which stores an electric charge from the PD 34.

<Equivalent Circuit for Solid-State Imaging Element in FIG. 2>

An equivalent circuit for the solid-state imaging element 11 depicted in FIG. 2 will now be described with reference to the circuit diagram of FIG. 3.

Figure 3:
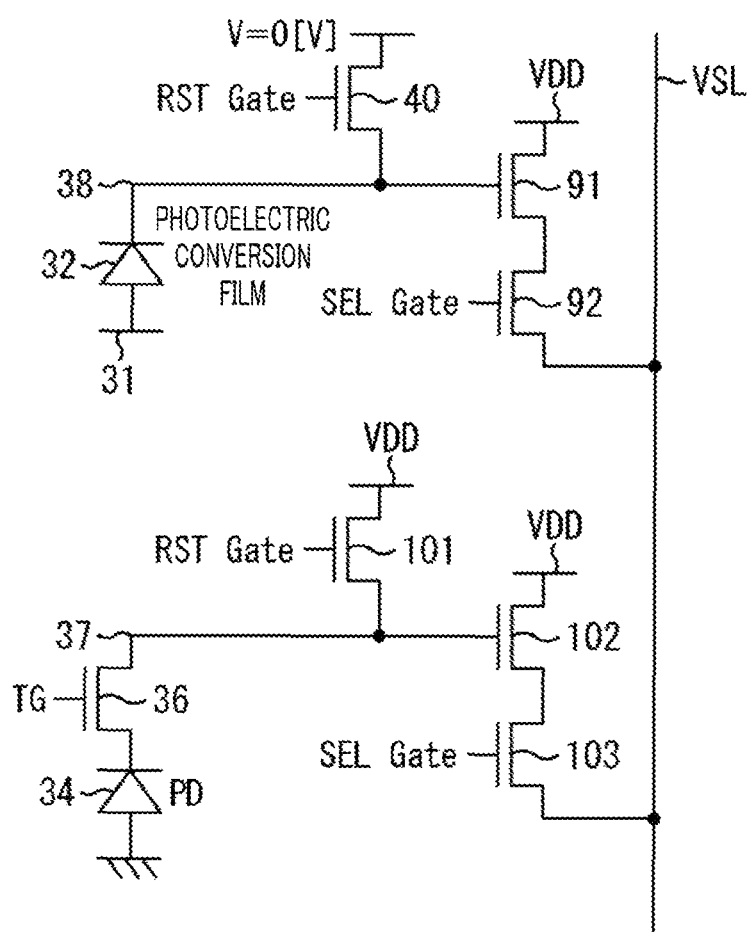
FIG. 3 is a wiring diagram of the solid-state imaging element depicted in FIG. 2.

Referring to FIG. 3, upper and lower imaging elements are connected to a vertical transfer line VSL. The upper imaging element generates a pixel signal on the basis of an electric charge that is generated by the photoelectric conversion film 32 including, for example, an organic film. The lower imaging element generates a pixel signal on the basis of an electric charge that is generated by the PD 34.

The upper imaging element depicted in FIG. 3 is configured so that the upper electrode 31, which is disposed in the lower part of FIG. 2, is connected to the anode of the photoelectric conversion film 32, and that the FD 38 is connected to the cathode of the photoelectric conversion film 32. Further, the FD 38 is connected to the source of the reset gate (RST Gate) 40 and to the gate of an amplifier transistor 91.

When a reset signal is inputted from the gate, the reset gate 40 is turned on, a ground potential (V=0 V) that is connected to the drain and has the same potential as the Pwell 33 is turned on, and the electric charge stored in the photoelectric conversion film 32 and the FD 38 is discharged.

Further, a power supply voltage VDD is applied between the source and drain of the amplifier transistor 91, and a pixel signal is outputted after being amplified by a voltage that is based on the electric charge stored in the FD 38 and inputted to the gate.

In a situation where a pixel is to be selected and subjected to pixel signal transfer, a selection gate (SEL Gate) 92 is turned on when a selection signal is inputted to the gate. When turned on by the selection signal, the selection gate (SEL Gate) 92 transfers the output from the amplifier transistor 91 through the vertical transfer line VSL.

The lower imaging element depicted in FIG. 3 is configured so that the anode of the PD 34 is grounded, and that the FD 37 is connected to the cathode of the PD 34 through the source/drain of the transfer gate (TG) 36. When a transfer signal is inputted to the gate, the transfer gate 36 turns on and transfers the electric charge stored in the PD 34 to the FD 37. The FD 37 is connected to the source of a reset gate (RST Gate) 101 and to the gate of an amplifier transistor 102.

When a reset signal is inputted from the gate, the reset gate 101 is turned on, the power supply voltage VDD connected to the drain of the reset gate 101 is turned on, and the electric charge stored in the FD 37 is discharged. If the transfer gate 36 is on in this instance, the electric charge stored in the PD 34 is also discharged.

Further, the power supply voltage VDD is applied between the source and drain of the amplifier transistor 102, and a pixel signal is outputted after being amplified by a voltage that is based on the electric charge stored in the FD 37 and inputted to the gate.

In a situation where a pixel is to be selected and subjected to pixel signal transfer, a selection gate (SEL Gate) 103 is turned on when a selection signal is inputted to the gate. When turned on by the selection signal, the selection gate (SEL Gate) 103 transfers the output from the amplifier transistor 102 through the vertical transfer line VSL.

That is to say, the reset voltage V of the photoelectric conversion film 32 is set to 0 V, and the reset voltage of the PD 34 is set to the power supply voltage VDD. Diffusion leakage of the FD 38 occurs with a minority carrier concentration gradient in the P-type impurity layer 71. Therefore, raising the concentration of the P-type impurity layer 71 below the FD 38 reduces the diffusion leakage in the FD 38 and the dark current in the adjacent PD 34.

Figure 4:
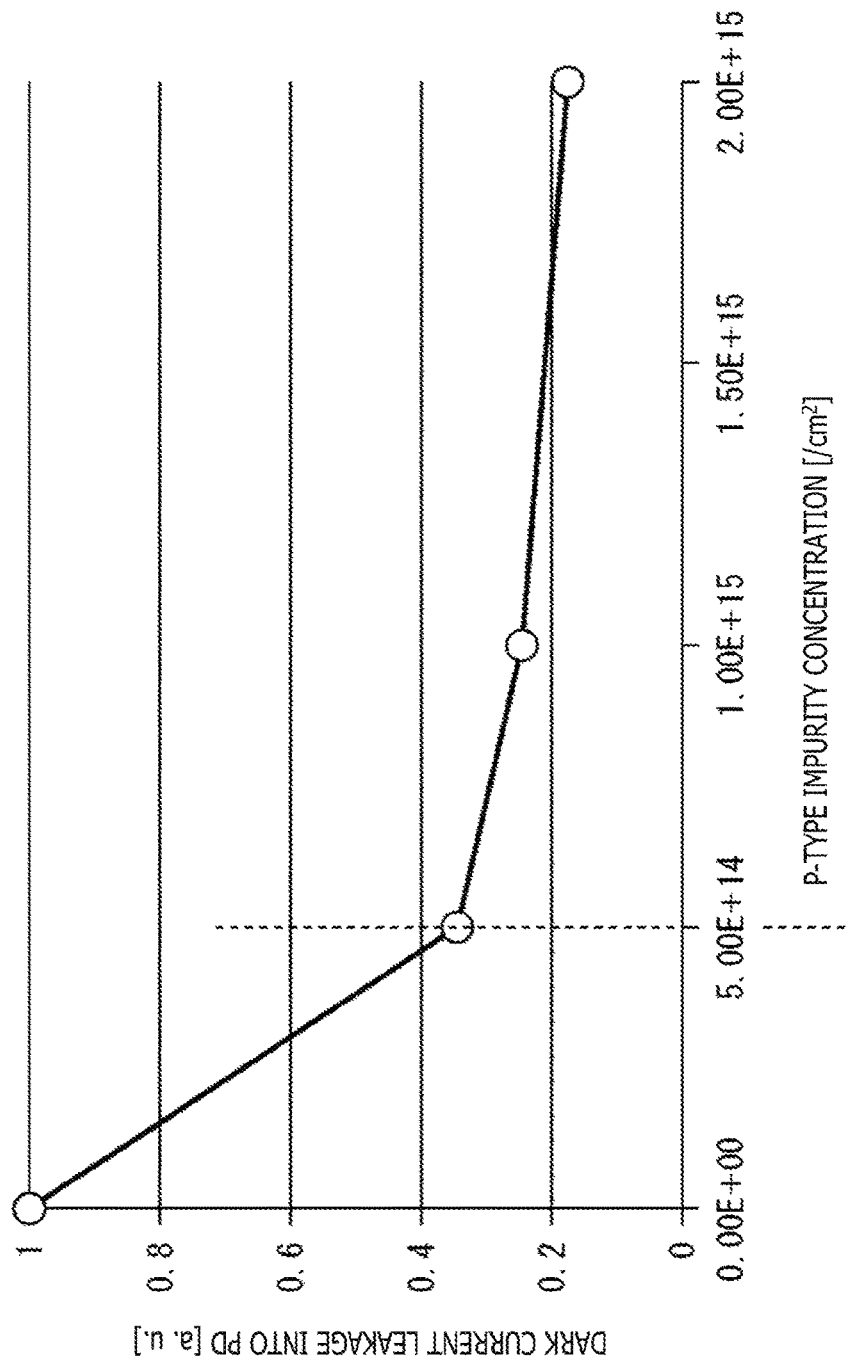
FIG. 4 is a diagram illustrating the relationship between the P-type impurity concentration of a P-type impurity layer in the solid-state imaging element depicted in FIG. 2 and a dark current flowing into a PD.

Further, when calculated by a device simulator, the relationship between the dark current in the PD 34 and the P-type impurity concentration of the P-type impurity layer 71 below the FD 38 is as illustrated in FIG. 4.

More specifically, as compared to the dark current in the PD 34 in a case where the P-type impurity layer 71 is not formed (the P-type impurity concentration is 0.00 E+00/cm), the PD dark current can be reduced to approximately ⅓ when the P-type impurity concentration exceeds 5.00 E+14/cm$^2$, and can be further reduced to ⅕ or less when the P-type impurity concentration is 2.00 E+15/cm$^2$, as illustrated in FIG. 4.

It is indicated that diffusion leakage is suppressed when the P-type impurity layer 71 is below the N-type impurity layer 51 included in the PD 38 and formed to have a high concentration. Further, the reset voltage to be applied to the FD 38 can be set to the same 0 V as the substrate potential. Thus, the potential in the FD 38 in a dark state is close to 0 V. This makes it possible to inhibit the occurrence of junction leakage between the FD 38 and the Pwell 33 and between the FD 38 and the STI regions 39-1 and 39-2.

As a result, when, in any case, the solid-state imaging element 11 is configured as illustrated in FIG. 2 so that the P-type impurity layer 71 is disposed below the N-type impurity layer 51, which forms the FD 38, the diffusion leakage and junction leakage in the FD 38 can be both suppressed.

<Thicknesses of N-Type Impurity Layer and P-Type Impurity Layer in FD 38>

Figure 5:
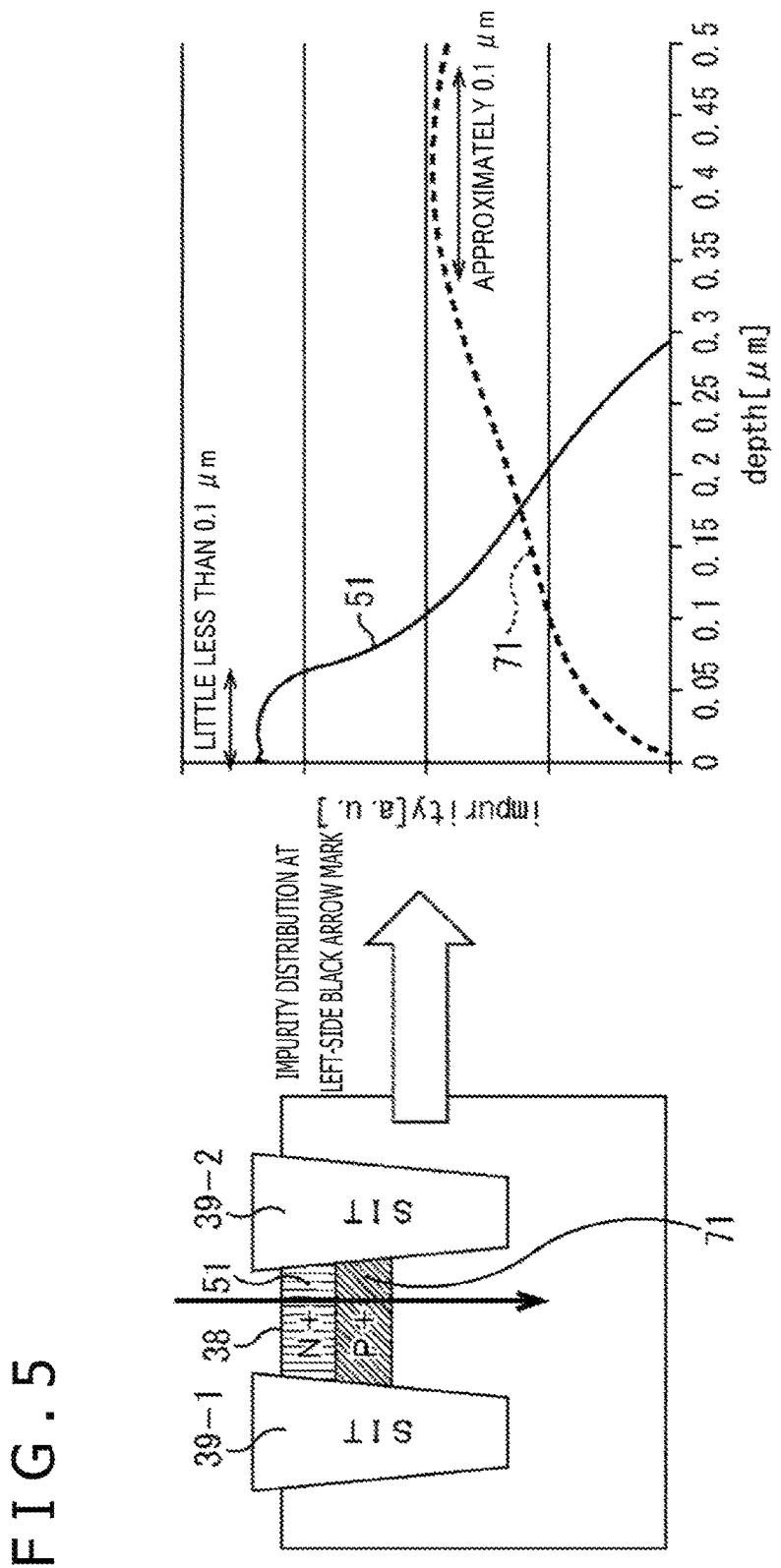
FIG. 5 is a diagram illustrating the depth-direction distribution of an FD and a P-type impurity layer.

Further, the thicknesses of the N-type impurity layer 51 and P-type impurity layer 71 in the FD 38 have distributions indicated in the right half of FIG. 5 when, as indicated, for example, in the left half of FIG. 5, the depth is referenced to the top of the N-type impurity layer 51 with respect to a direction indicated by an arrow for the N-type impurity layer 51 and P-type impurity layer 71 in the FD 38. Note that in the left half of FIG. 5, the horizontal axis represents depth, and the vertical axis represents the concentrations of N- and P-type impurities in an appropriate unit.

That is to say, the N-type impurities are weaker than the P-type impurities in acceleration energy for ion implantation. Therefore, the N-type impurity layer 51 is formed to be relatively thin. Meanwhile, the P-type impurities require a certain amount of I.I. energy in order to avoid interference with the P-type impurities. Therefore, the N-type impurity layer 51 is formed to bP thicker than the P-type impurity layer 71.

<Manufacturing Process>

Figure 6:
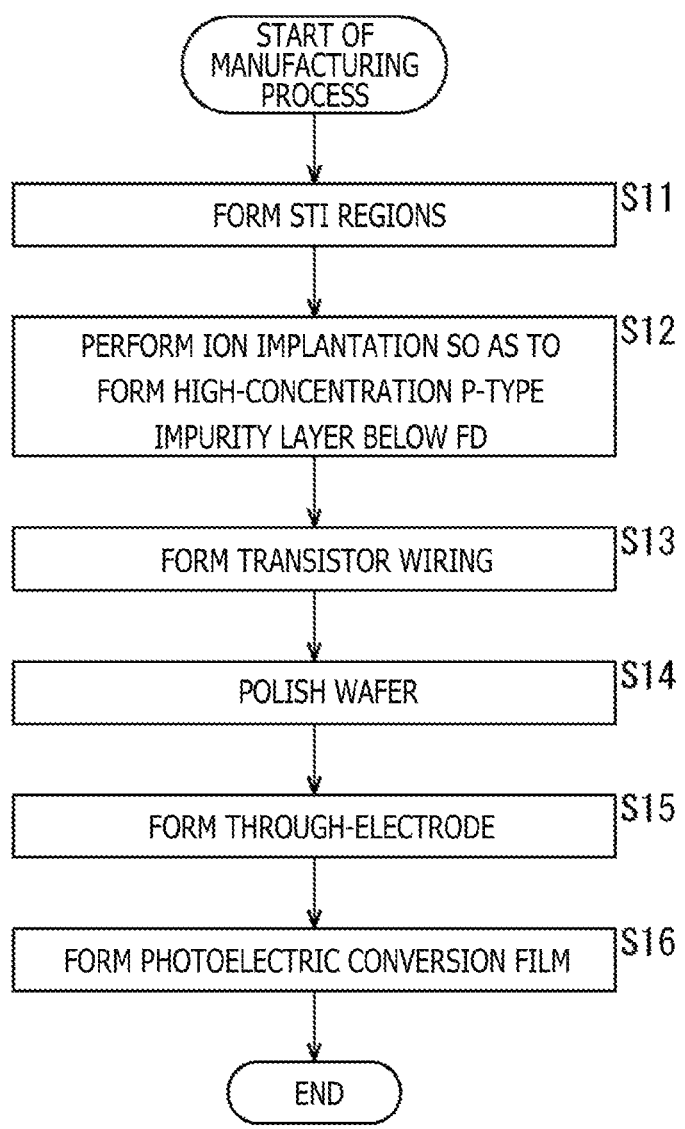
FIG. 6 is a flowchart illustrating a process of manufacturing the solid-state imaging element depicted in FIG. 2.

A process of manufacturing the solid-state imaging element 11 depicted in FIG. 2 will now be described with reference to the flowchart of FIG. 6 and the manufacturing process diagram of FIG. 7.

Figure 7:
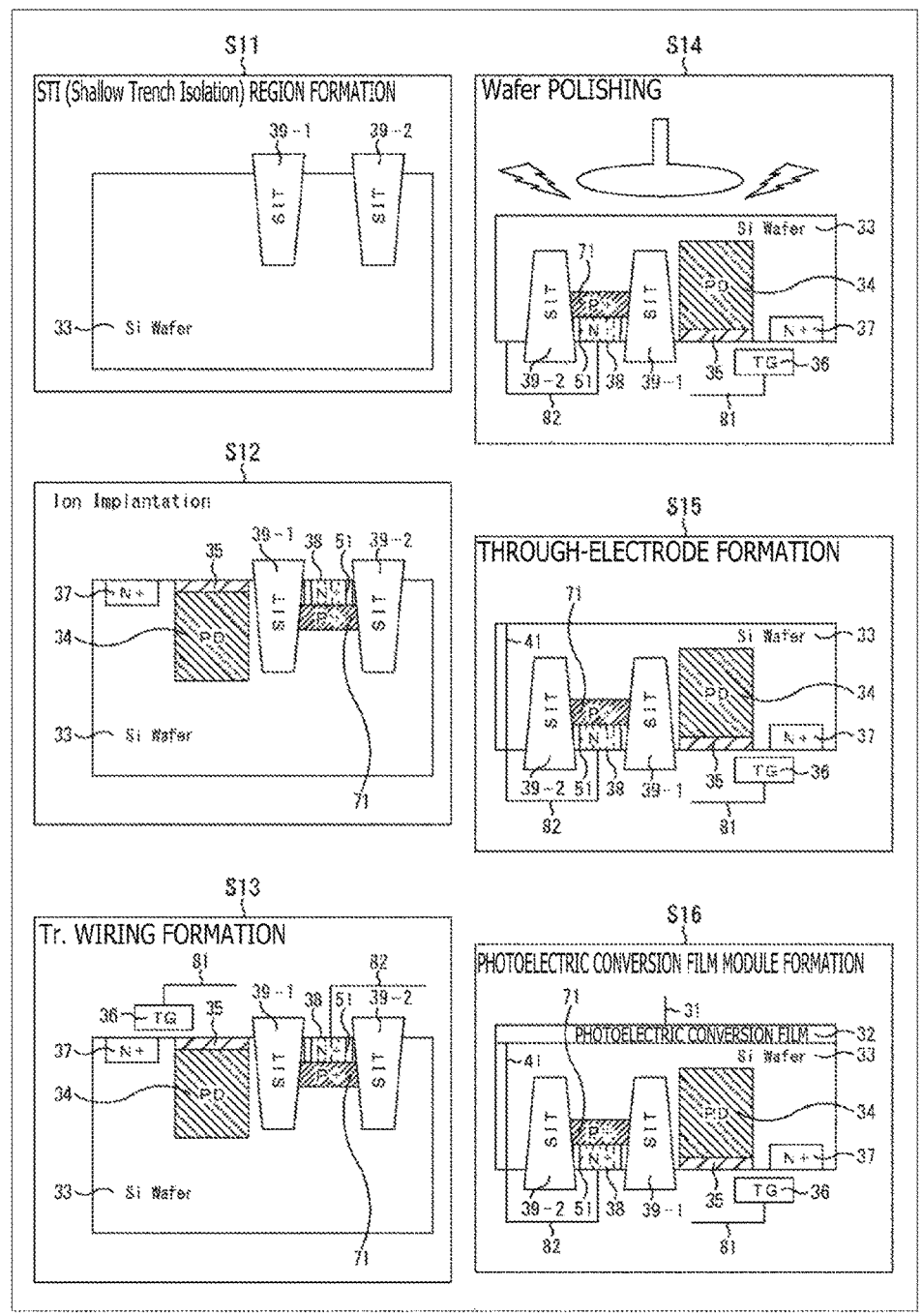
FIG. 7 is a diagram illustrating the process of manufacturing the solid-state imaging element depicted in FIG. 2.

In step S11, as indicated in the upper left of FIG. 7, a shallow trench is formed in a silicon wafer (Si Wafer) forming the Pwell 33, and then the trench is filled with an insulator including $SiO_2$ or other oxide film in order to form the STI (Silicon Trench Isolation) regions 39-1 and 39-2. A later-described process is performed to form the FD 38 between the STI regions 39-1 and 39-2 in order to store the electric charge generated by the photoelectric conversion film 32.

In step S12, as indicated in the middle left of FIG. 7, ion implantation is performed to form the PD 34, the P-type impurity layer 35, the N-type impurity layer 37, the N-type impurity layer 51 forming the FD 38, and the P-type impurity layer 71. Here, as a general rule, lower to upper components as viewed in FIG. 7 are sequentially formed in the order named. In a case indicated in the middle left of FIG. 7, therefore, the P-type impurity layer 71, the PD 34, the P-type impurity layer 35, the N-type impurity layer 37, and the N-type impurity layer 51 are sequentially formed generally in the order named. Here, the P-type impurity layer 71 may be formed, for example, to have a concentration higher than 5.00 E+14/cm$^2$ in order to more surely suppress junction leakage and diffusion leakage.

In step S13, as indicated in the lower left of FIG. 7, a transistor wiring 81 for the transfer gate 36 and a wiring 82 for the photoelectric conversion film 32 are formed.

In step S14, as indicated in the upper right of FIG. 7, vertical inversion is performed to polish the silicon wafer (Si Wafer) in which the Pwell 33 is to be formed. The silicon wafer (Si Wafer) is now depicted in the upper part of FIG. 7.

In step S15, as indicated in the middle right of FIG. 7, an electrode 41 acting as a through-electrode for the photoelectric conversion film 32 is formed on the silicon wafer (Si Wafer) in which the Pwell 33 is to be formed, and then connected to the wiring 82.

In step S16, as indicated in the lower right of FIG. 7, the photoelectric conversion film 32 including an organic film is formed on the upper surface of the silicon wafer (Si Wafer) in which the Pwell 33 is to be formed. In addition, the upper electrode 31 is formed to complete the solid-state imaging element 11.

The above-described process is performed so that the PD 34 and the photoelectric conversion film 32 are disposed on an identical substrate, and that the P-type impurity layer 71 is disposed below the N-type impurity layer 51 forming the FD 38, which stores the electric charge generated by the photoelectric conversion film 32. Consequently, diffusion leakage and junction leakage in the FD 38 can be suppressed.

Second Embodiment

It is assumed in the foregoing example that the PD 34 includes an N-type impurity layer, and that the photoelectric conversion film 32 generates a hole charge. However, even if polarity is inverted to achieve an alternative configuration, the similar advantages can be provided.

Figure 8:
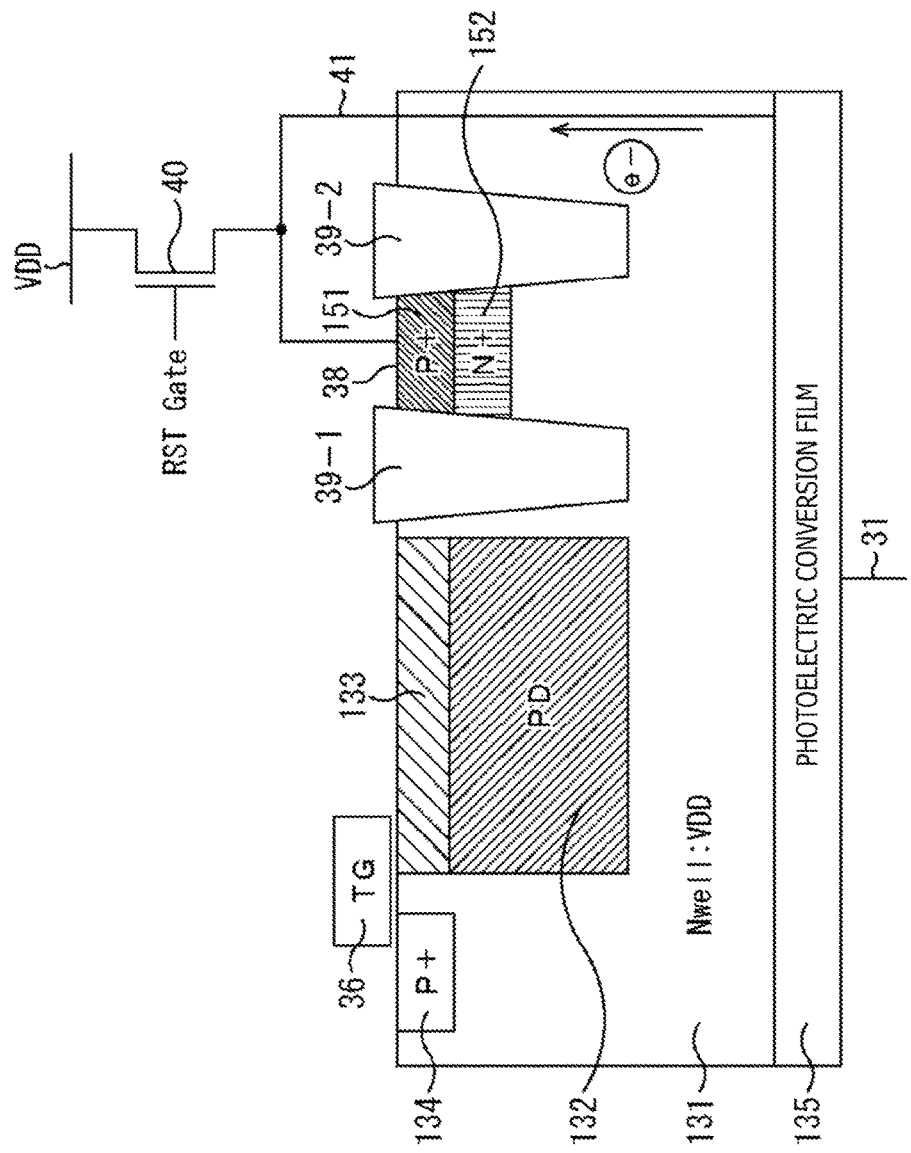
FIG. 8 is a diagram illustrating an exemplary configuration of the solid-state imaging element according to a second embodiment of the present technology.

FIG. 8 illustrates an exemplary configuration of the solid-state imaging element 11 that is obtained by inverting the polarity of the solid-state imaging element 11 depicted in FIG. 2. More specifically, the solid-state imaging element 11 depicted in FIG. 8 includes a photoelectric conversion film 135, a Nwell 131, a PD 132, an N-type impurity layer 133, a P-type impurity layer 134, an FD 38 including a P-type impurity layer 151, and an Ntype impurity layer 152. These components are obtained by inverting the polarities of the photoelectric conversion film 32, Pwell 33, PD 34, P-type impurity layer 35, Ntype impurity layer 37, N-type impurity layer 51, and Ptype impurity layer 71 in the solid-state imaging element 11 depicted in FIG. 2.

That is to say, in the present example, the PD 132 includes a P-type impurity layer, and the photoelectric conversion film 135 generates an electric charge and transfers the electric charge (indicated by an encircled "e+" mark in FIG. 8) to the FD 38 through the wiring 41.

Figure 9:
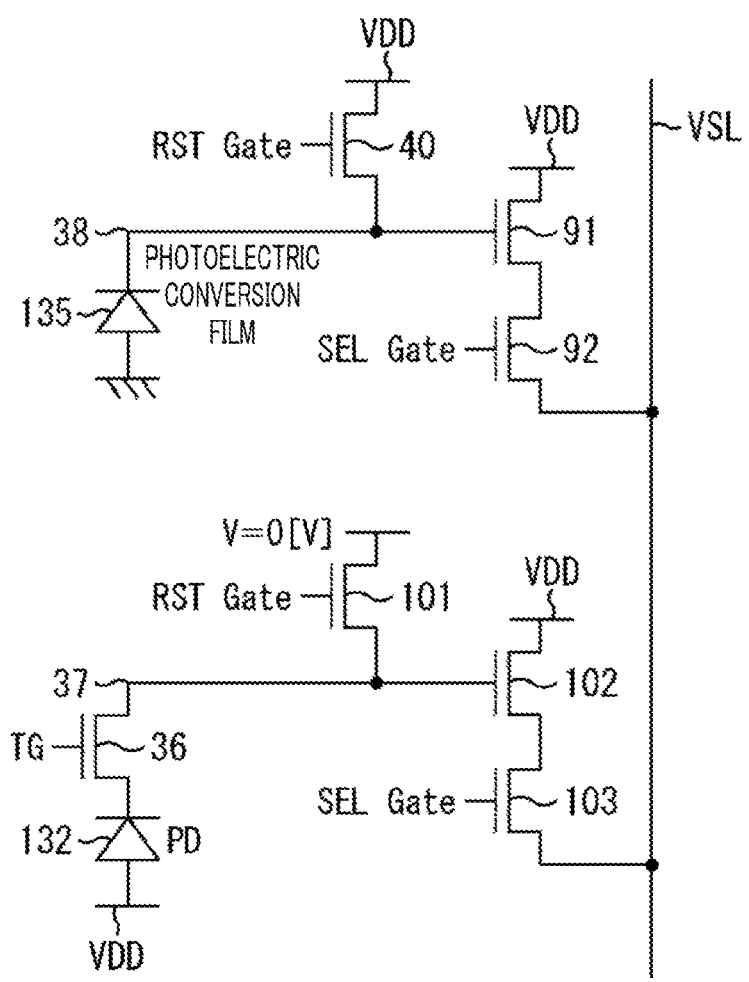
FIG. 9 is a wiring diagram of the solid-state imaging element depicted in FIG. 8.

However, as indicated in the wiring diagram of FIG. 9, the solid-state imaging element 11 depicted in FIG. 8 is configured so that the drain of the reset gate 40 for the photoelectric conversion film 135 is at the power supply voltage VDD, and that the drain of the reset gate 101 for the PD 132 is at a voltage of 0 V.

Note that components that are depicted in the wiring diagram of FIG. 9 and similar to those in the wiring diagram of FIG. 3 are designated by the same name and the same reference numerals as their counterparts and will not redundantly be described. That is to say, the wiring diagram of FIG. 9 differs from the wiring diagram of FIG. 3 in that the photoelectric conversion film 135 and the PD 132 are disposed instead of the photoelectric conversion film 32 and the PD 34, and that the drain of the reset gate 40 for the photoelectric conversion film 135 is at the power supply voltage VDD, and further that the drain of the reset gate 101 for the PD 132 is at a voltage of 0 V.

Consequently, in the configuration illustrated in FIG. 8, increasing the concentration of the N-type impurity layer 152 facilitates the suppression of diffusion leakage and junction leakage in the FD 38.

The process of manufacturing the solid-state imaging element 11 depicted in FIG. 8 is not described here because it similarly manufactures the components corresponding to those of the solid-state imaging element 11 depicted in FIG. 2.

First Modification

It is assumed in an earlier example that, as indicated in the solid-state imaging element 11 in FIG. 2, the P-type impurity layer 71 is disposed directly below the N-type impurity layer 51 forming the FD 38. Alternatively, however, the P-type impurity layer 71 may be disposed at a deeper position relative to the N-type impurity layer 51.

Figure 10:
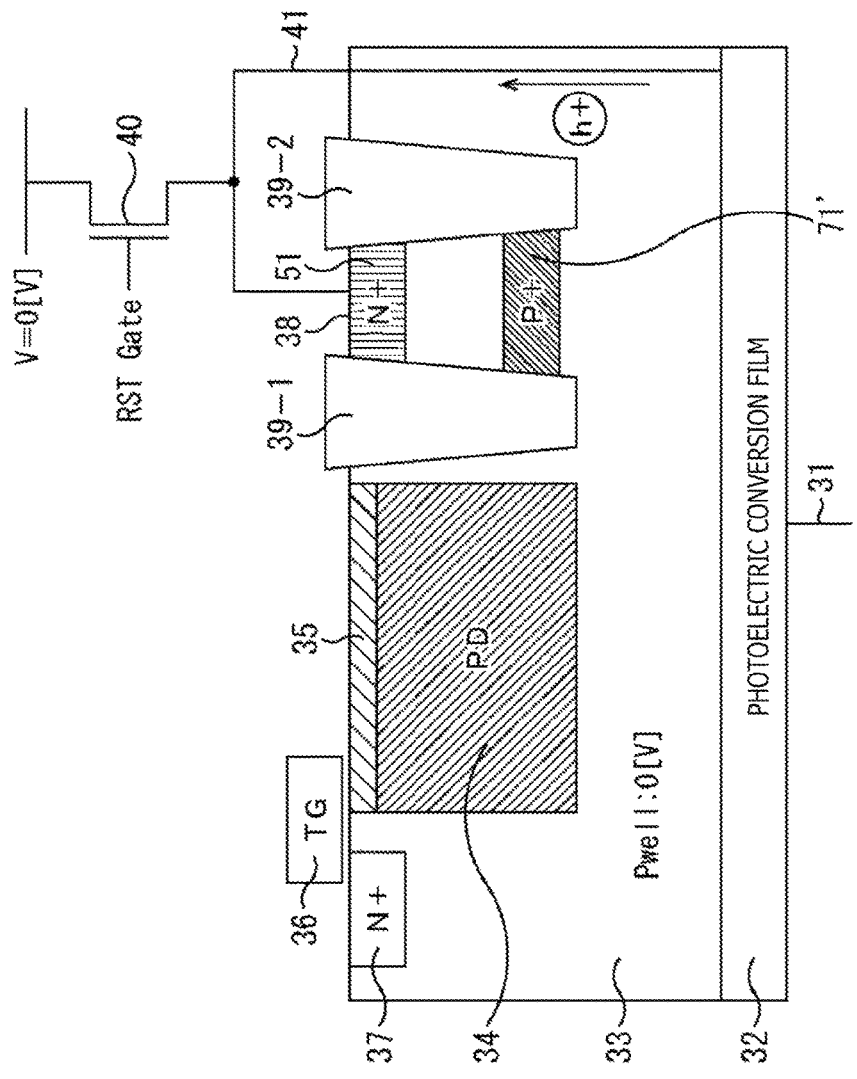
FIG. 10 is a diagram illustrating the solid-state imaging element according to a first modification of the first embodiment of the present technology.

FIG. 10 illustrates an exemplary configuration of the solid-state imaging element 11 in which the P-type impurity layer 71 is replaced by a P-type impurity layer 71' that is disposed at a deeper position relative to the N-type impurity layer 51.

More specifically, as illustrated in FIG. 10, the P-type impurity layer 71' is disposed below the N-type impurity layer 51 forming the FD 38 and at a deeper position relative to the N-type impurity layer 51 while a noncontact space having a predetermined depth is provided between the P-type impurity layer 71' and the N-type impurity layer 51. This relaxes the electric field between the FD 38 and the P-type impurity layer 71'. Therefore, junction leakage can be further suppressed.

Note that in the solid-state imaging element 11 according to the second embodiment, which is depicted in FIG. 8, the N-type impurity layer 152 is disposed at a deeper position relative to the P-type impurity layer 151 forming the FD 38.

Second Modification

It is assumed in the foregoing example that, as indicated in the solid-state imaging element 11 in FIG. 10, junction leakage is suppressed by disposing the P-type impurity layer 71' directly below the N-type impurity layer 51 forming the FD 38 and at a deeper position relative to the N-type impurity layer 51.

Alternatively, however, an N-type impurity layer 171 may be disposed between the N-type impurity layer 51 and the deeply positioned P-type impurity layer 71'.

Figure 11:
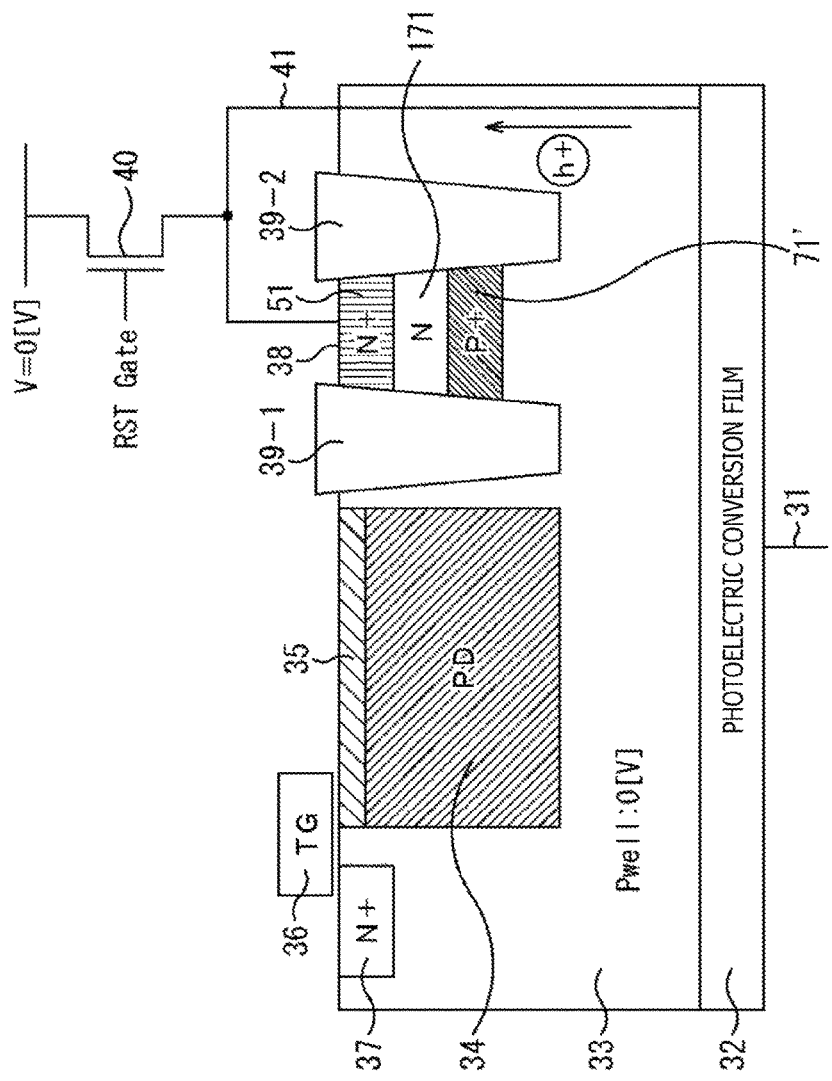
FIG. 11 is a diagram illustrating the solid-state imaging element according to a second modification of the first embodiment of the present technology.

FIG. 11 illustrates an exemplary configuration of the solid-state imaging element 11 in which the low-concentration N-type impurity layer 171 is disposed between the N-type impurity layer 51 and the P-type impurity layer 71'.

That is to say, when the N-type impurity layer 171 is disposed between the P-type impurity layer 71' and the N-type impurity layer 51 forming the FD 33 as illustrated in FIG. 11, the N-type impurity layer 171 relaxes the electric field between the FD 38 and the P-type impurity layer 71' positioned in the vicinity of the FD 38. Therefore, junction leakage can be further suppressed.

Note that in the solid-state imaging element 11 according to the second embodiment, which is depicted in FIG. 8, the N-type impurity layer 152 is disposed at a deeper position relative to the P-type impurity layer 151 forming the FD 38, and a P-type impurity layer is disposed between the N-type impurity layer 152 and the P-type impurity layer 151 forming the FD 38.

<Exemplary Applications to Electronic Apparatuses>

The above-described solid-state imaging element is applicable to various electronic apparatuses such as digital still cameras, digital video cameras, and other imaging devices, mobile telephones having an image pick-up function, and other electronic apparatuses having an image pick-up function.

Figure 12:
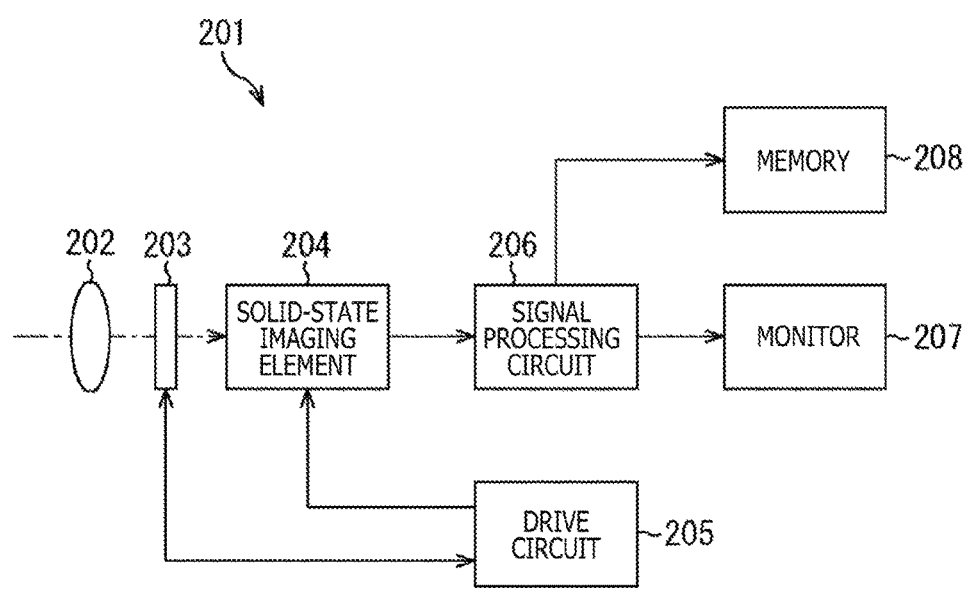
FIG. 12 is a schematic diagram illustrating an exemplary application of an electronic apparatus to which the solid-state imaging element according to the present technology is applied.

FIG. 12 is a block diagram illustrating an exemplary configuration of an imaging device operated as an electronic apparatus to which the present technology is applied.

An imaging device 201 illustrated in FIG. 12 includes an optical system 202, a shutter device 203, a solid-state imaging element 204, a drive circuit 205, a signal processing circuit 206, a monitor 207, and a memory 208, and is capable of capturing a still image and a moving image.

The optical system 202 includes one or more lenses, directs light from a subject (incident light) to the solid-state imaging element 204, and forms an image on a light-receiving surface of the solid-state imaging element 204.

The shutter device 203 is disposed between the optical system 202 and the solid-state imaging element 204. Under the control of the drive circuit 1005, the shutter device 203 controls a light irradiation period and light shielding period for the solid-state imaging element 204.

The solid-state imaging element 204 includes a package containing the above-described solid-state imaging element 11. In accordance with light that falls upon the light-receiving surface through the optical system 202 and the shutter device 203, the solid-state imaging element 204 stores a signal charge for a predetermined period. The signal charge stored in the solid-state imaging element 204 is transferred in accordance with a drive signal (timing signal) supplied from the drive circuit 205.

The drive circuit 205 drives the solid-state imaging element 204 and the shutter device 203 by outputting drive signals for controlling the transfer operation of the solid-state imaging element 204 and the shutter operation of the shutter device 203.

The signal processing circuit 206 performs various signal processes on the signal charge outputted from the solid-state imaging element 204. An image (image data) derived from signal processing by the signal processing circuit 206 is supplied to the monitor 207 and displayed or supplied to the memory 208 and stored (recorded).

When the solid-state imaging element 11 is applied to the imaging device 201 configured as described above instead of the above-described solid-state imaging element 204, diffusion leakage and function leakage can be both suppressed.

<Exemplary Uses of Solid-State imaging Element>

Figure 13:
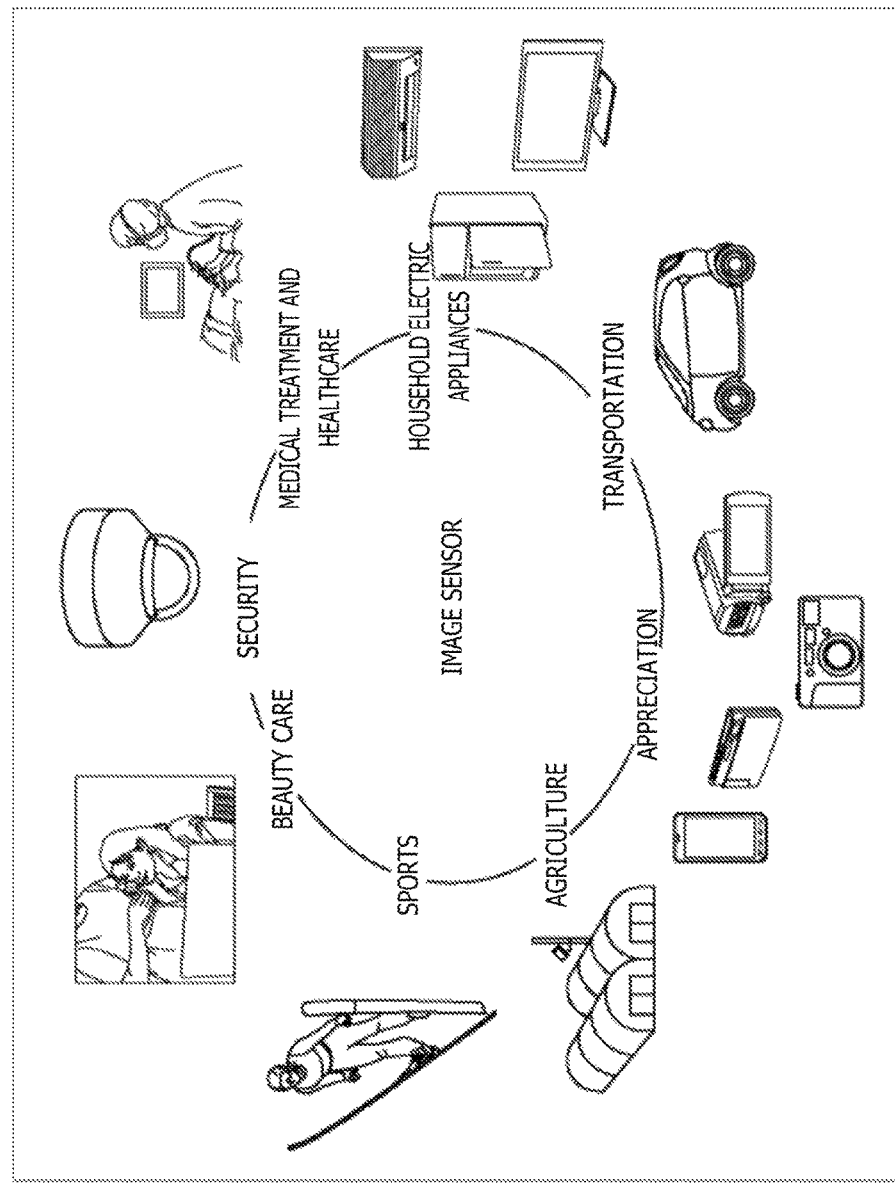
FIG. 13 is a diagram illustrating exemplary uses of the solid-state imaging element according to the present technology.

FIG. 13 is a diagram illustrating exemplary uses of the above-described solid-state imaging element.

The above-described solid-state imaging element can be used, for example, in various following cases where visible light, infrared light, ultraviolet light, X-ray light, or other light is to be sensed as indicated below.

A device used to capture images for appreciation, such as a digital camera or a mobile device with a camera function A device used for transportation, such as a vehicle-mounted sensor for capturing an image depicting, for example, a forward or rearward view from a vehicle, a view around the vehicle, or the interior of the vehicle in order to provide an automatic stop feature and other safety driving features and recognize the status of a vehicle driver, a monitoring camera for monitoring traveling vehicles and roads, or a distance measuring sensor for measuring, for example, an inter-vehicle distance A device used with a TV set, a refrigerator, an air conditioner, or other household electric appliance in order to capture an image of a user's gesture and operate such an electric appliance in accordance with the gesture A device used with an endoscope, an angiographic instrument adapted to receive infrared light, or other medical treatment or healthcare instrument A device used for security purposes, such as a monitoring camera for crime prevention or a camera for personal authentication A device used for beauty care, such as a skin measuring instrument for capturing an image of skin or a microscope for capturing an image of a scalp A device used for sports, such as an action camera or a wearable camera for sporting and other events A device used for agriculture, such as a camera for monitoring the status of farms and farm products Note that the present technology may adopt the following configurations as well.

<1> A solid-state imaging element including:
a photodiode that performs photoelectric conversion on the basis of the amount of incident light;
a photoelectric conversion film that performs photoelectric conversion on the basis of the amount of incident light;
a diffusion layer that has a second polarity and stores an electric charge derived from photoelectric conversion by the photoelectric conversion film, the second polarity being different from a first polarity possessed by the photodiode; and
an impurity layer that includes impurities having the first polarity,
in which the photodiode and the diffusion layer are disposed on an identical substrate in parallel with each other, and
the impurity layer is disposed below the diffusion layer.

<2> The solid-state imaging element as described in <1> above, in which the impurity layer is disposed below the diffusion layer at a concentration higher than a predetermined value.

<3> The solid-state imaging element as described in <2> above, in which the impurity layer is disposed below the diffusion layer at a concentration higher than 2.00 E+15/cm.

<4> The solid-state imaging element as described in any one of <1> to <3> above, in which the impurity layer is disposed below the diffusion layer and at a predetermined distance from the diffusion layer.

<5> The solid-state imaging element as described in any one of <1> to <3> above, in which the impurity layer is disposed below the diffusion layer with a predetermined substance sandwiched between the impurity layer and the diffusion layer.

<6> The solid-state imaging element as described in <1> above, in which the predetermined substance includes an impurity layer having the second polarity.

<7> A solid-state imaging element manufacturing method for manufacturing a solid-state imaging element,
in which the solid-state imaging element includes
a photodiode that performs photoelectric conversion on the basis of the amount of incident light,
a photoelectric conversion film that performs photoelectric conversion on the basis of the amount of incident light,
a diffusion layer that has a second polarity and stores an electric charge derived from photoelectric conversion by the photoelectric conversion film, the second polarity being different from a first polarity possessed by the photodiode, and
an impurity layer that includes impurities having the first polarity,
the photodiode and the diffusion layer are disposed on an identical substrate in parallel with each other, and
the impurity layer is disposed below the diffusion layer.

<8> An electronic apparatus including:
a photodiode that performs photoelectric conversion on the basis of the amount of incident light;
a photoelectric conversion film that performs photoelectric conversion on the basis of the amount of incident light;
a diffusion layer that has a second polarity and stores an electric charge derived from photoelectric conversion by the photoelectric conversion film, the second polarity being different from a first polarity possessed by the photodiode; and
an impurity layer that includes impurities having the first polarity,
in which the photodiode and the diffusion layer are disposed on an identical substrate in parallel with each other, and
the impurity layer is disposed below the diffusion layer.

REFERENCE SIGNS LIST

11 Solid-state imaging element
31 Upper wiring
32 Photoelectric conversion film
33 Pwell
34 PD
35 P-type impurity layer
36 Transfer gate
37 N-type impurity layer
38 FD
39-1, 39-2 STI
40 Reset gate
41 Wiring
51 N-type impurity layer
71, 71' P-type impurity layer
91 Amplifier transistor
92 Selection gate
101 Reset gate
102 Amplifier transistor
103 Selection gate
131 Nwell
132 PD
133 N-type impurity layer
134 P-type impurity layer
135 Photoelectric conversion film
151 P-type impurity layer
152 N-type impurity layer
171 N-type impurity layer

What is claimed is:
1. A solid-state imaging element comprising:
a photodiode that performs photoelectric conversion on a basis of an amount of incident light;
a photoelectric conversion film that performs photoelectric conversion on the basis of the amount of incident light;
a diffusion layer that has a second polarity and stores an electric charge derived from the photoelectric conversion by the photoelectric conversion film, the second polarity being different from a first polarity of the photodiode; and
an impurity layer that includes impurities having the first polarity, wherein the photodiode and the diffusion layer are disposed on a same substrate in parallel with each other, and wherein the impurity layer is disposed below the diffusion layer.

2. The solid-state imaging element according to claim 1, wherein the impurity layer is disposed below the diffusion layer at a concentration higher than a predetermined value.

3. The solid-state imaging element according to claim 2, wherein the impurity layer is disposed below the diffusion layer at a concentration higher than $2.00E+15/cm^2$.

4. The solid-state imaging element according to claim 1, wherein the impurity layer is disposed below the diffusion layer and at a predetermined distance from the diffusion layer.

5. The solid-state imaging element according to claim 1, wherein the impurity layer is disposed below the diffusion layer with a substance sandwiched between the impurity layer and the diffusion layer.

6. The solid-state imaging element according to claim 5, wherein the substance includes an impurity layer having the second polarity.

7. A method for manufacturing a solid-state imaging element, comprising:
   forming a photodiode that performs photoelectric conversion on a basis of an amount of incident light,
   forming a photoelectric conversion film that performs photoelectric conversion on the basis of the amount of incident light,
   forming a diffusion layer that has a second polarity and stores an electric charge derived from photoelectric conversion by the photoelectric conversion film, the second polarity being different from a first polarity possessed by the photodiode, and
   forming an impurity layer that includes impurities having the first polarity,
   wherein the photodiode and the diffusion layer are disposed on a same substrate in parallel with each other, and
   wherein the impurity layer is disposed below the diffusion layer.

8. An electronic apparatus, comprising:
   a photodiode that performs photoelectric conversion on a basis of an amount of incident light;
   a photoelectric conversion film that performs photoelectric conversion on the basis of the amount of incident light;
   a diffusion layer that has a second polarity and stores an electric charge derived from photoelectric conversion by the photoelectric conversion film, the second polarity being different from a first polarity possessed by the photodiode; and
   an impurity layer that includes impurities having the first polarity, wherein the photodiode and the diffusion layer are disposed on a same substrate in parallel with each other, and
   wherein the impurity layer is disposed below the diffusion layer.

* * * * *